CONTROLLED SIGNAL AMPLIFYING SYSTEM

Filed Aug. 25, 1967 Sheet 1 of 2

INVENTOR.
Terence J. Knowles
BY James E. Tracy
Attorney 3,454,892

CONTROLLED SIGNAL AMPLIFYIING SYSTEM

Terence J. Knowles, Oak Park, Ill., assignor to Zenith Radio Corporation, Chicago, Ill., a corporation of Delaware Filed Aug. 25, 1967, Ser. No. 663,436
Int. Cl. H03g *3/30;* H03f *3/42*
U.S. Cl. 330—29 8 Claims

ABSTRACT OF THE DISCLOSURE

A parameter, such as gain, of an amplifier comprising a plurality of D.C. coupled cascaded transistorized amplifying stages is controlled by applying a D.C. control signal to the input of one of the stages to change its operating point. Operating point stabilization of the stages following the one controlled is achieved by effectively neutralizing the control signal which manifests in the output of the controlled stage. In the described embodiments, the amplitude variations of the control signal are initially applied to the input of the stage subsequent to the controlled stage and a D.C. feedback path translates these variations back to the input of the controlled stage, to alter its operating point, and through the controlled stage to the input of the subsequent stage but in a sense opposite to that of the amplitude variations initially supplied to the subsequent stage thereby substantially cancelling the control signal and nullifying its effect on the succeeding stages.

Figure 1:
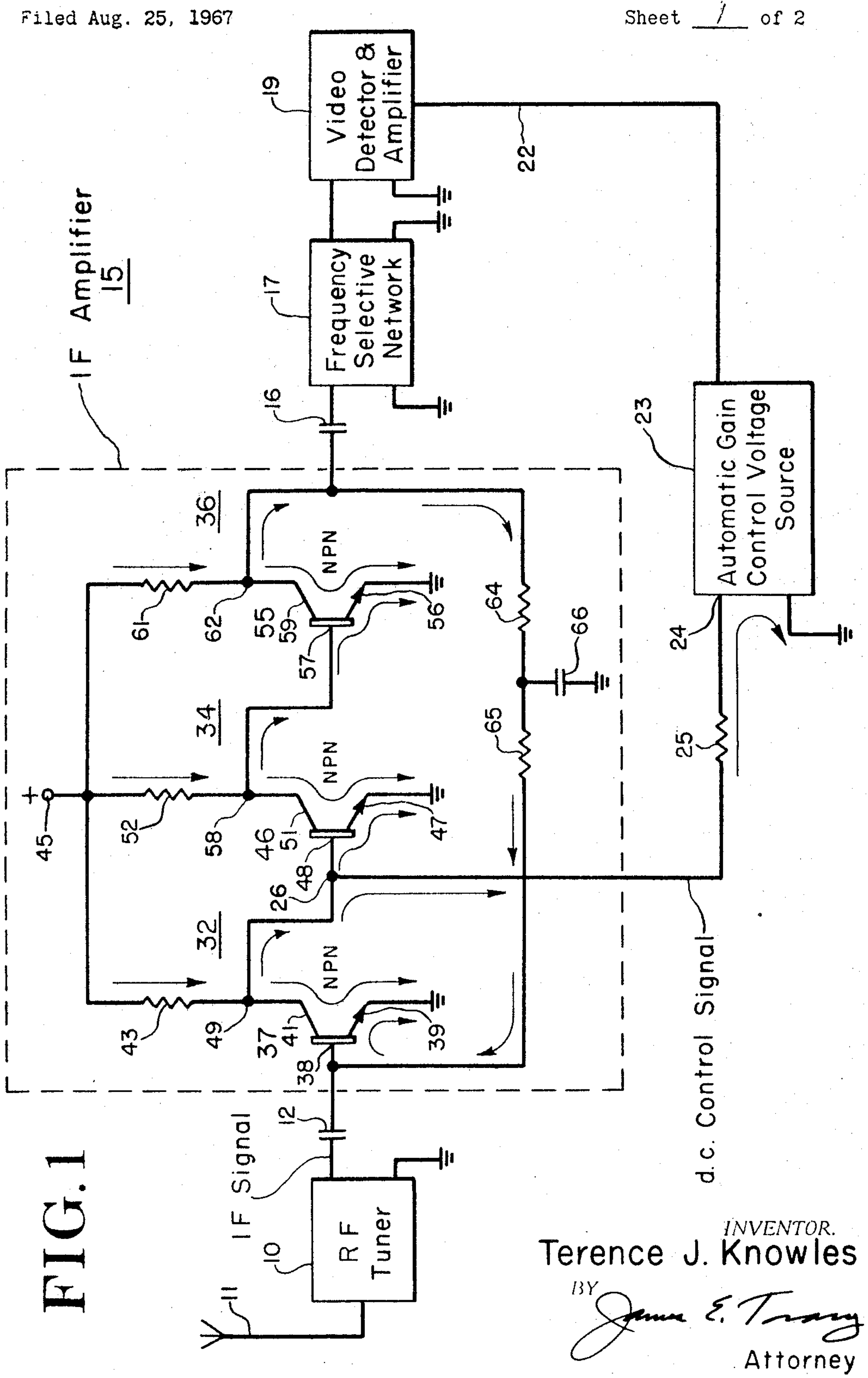

This invention pertains to a novel plural-stage transistorized amplifier with D.C. interstage coupling, a parameter of which amplifier is controlled in response to a D.C. control signal. The amplifier may conveniently be reduced to an integrated circuit and, moreover, lends itself to many different uses and applications. As one example, it may be employed as an automatic gain controlled amplifier for the IF (i.e. intermediate frequency) signal in such an environment.

The employment of D.C. or direct coupling between the stages of a multi-stage amplifier is advantageous for several reasons. For example, it usually simplifies the circuit and thus minimizes cost. In addition, it permits the amplifier to exhibit a wide or broad frequency response. Furthermore, the use of D.C. interstage coupling eliminates entirely, or at least substantially reduces, the need for capacitors, and this is of considerable importance in realizing cost savings when the amplifier is constructed as an integrated circuit. This is especially true when it is desired to incorporate the amplifier into a monolithic structure.

Unfortunately, the use of D.C. coupling does create a stability problem if it is necessary to control some parameter of the amplifier in response to a D.C. control signal. Usually, each transistor amplifying stage is normally biased to operate at a predetermined operating or working point on its characteristic curve, namely the curve plotting its collector current as function of its collector voltage (relative to its emitter) for its static base current. The application of a D.C. control signal to one of the stages, such as to its base, achieves a variation of the static or quiescent currents of that stage with the result that an operating characteristic or parameter of that stage is altered. As an example, it is possible to vary the static emitter current which changes the input impedance of the stage and consequently its frequency response. It is also convenient to change the static emitter current (to vary the emitter resistance) in response to a D.C. control signal in order to regulate the gain of the stage, and hence the gain of the entire amplifier, in accordance with the strength of the signal to be amplified.

For maximum gain control, consistent with circuit economies, usually only the first or input stage of a multi-stage amplifier is gain controlled. Because of the D.C. interstage coupling, however, static current changes in one stage manifest in appreciable static current variation (and consequently a shift of the operating point) in each of the stages following the one that is controlled. The stages act as D.C. amplifiers with respect to the D.C. control signal. The current gain introduced in each stage results in a progressively increasing amount of operating point shift from one stage to the next. Operating point changes in the stages succeeding the one that is controlled is most undesirable for, among other reasons, their operation may be altered to the extent that the A.C. signal to be amplified by the amplifier becomes distorted as a result of at least one of the stages operating in a nonlinear portion of its characteristic curve. The last or output stage in particular is likely to introduce distortion to an A.C. signal since its operating point is altered to the greatest extent.

This problem has been overcome by the present invention. Operating point control of one of a plurality of direct coupled cascaded amplifying stages is achieved without materially affecting the operating point of each stage following the one controlled. Moreover, such results are obtained by means of a relatively simple and inexpensive circuit arrangement, and one that is easily integratable.

Accordingly, it is an object of the present invention to provide a new and improved controlled signal amplifying system.

It is another object of the invention to provide a plural-stage amplifier, with D.C. interstage coupling, in which the introduction of a D.C. control signal to one stage to control its operating point does not result in any significant shift of the operating points of the succeeding stages.

It is still another object to provide a simplified controlled signal amplifier, requiring few elements, and which lends itself to circuit integration.

It is another object of the invention to provide a plural-automatic gain controlled amplifier.

A controlled signal amplifying system, constructed in accordance with one aspect of the invention, comprises an amplifier which includes a plurality of D.C. coupled cascaded transistorized amplifying stages each of which is biased to operate at a particular operating point on its characteristic curve. There is a source of a D.C. control signal for controlling a predetermined parameter of the amplifier. Means are provided for utilizing the control signal to vary the operating point of one of the cascaded amplifying stages, other than the last stage, to change the predetermined parameter of the amplifier without significantly altering the operating point of each stage following the aforementioned one stage.

Figure 2:
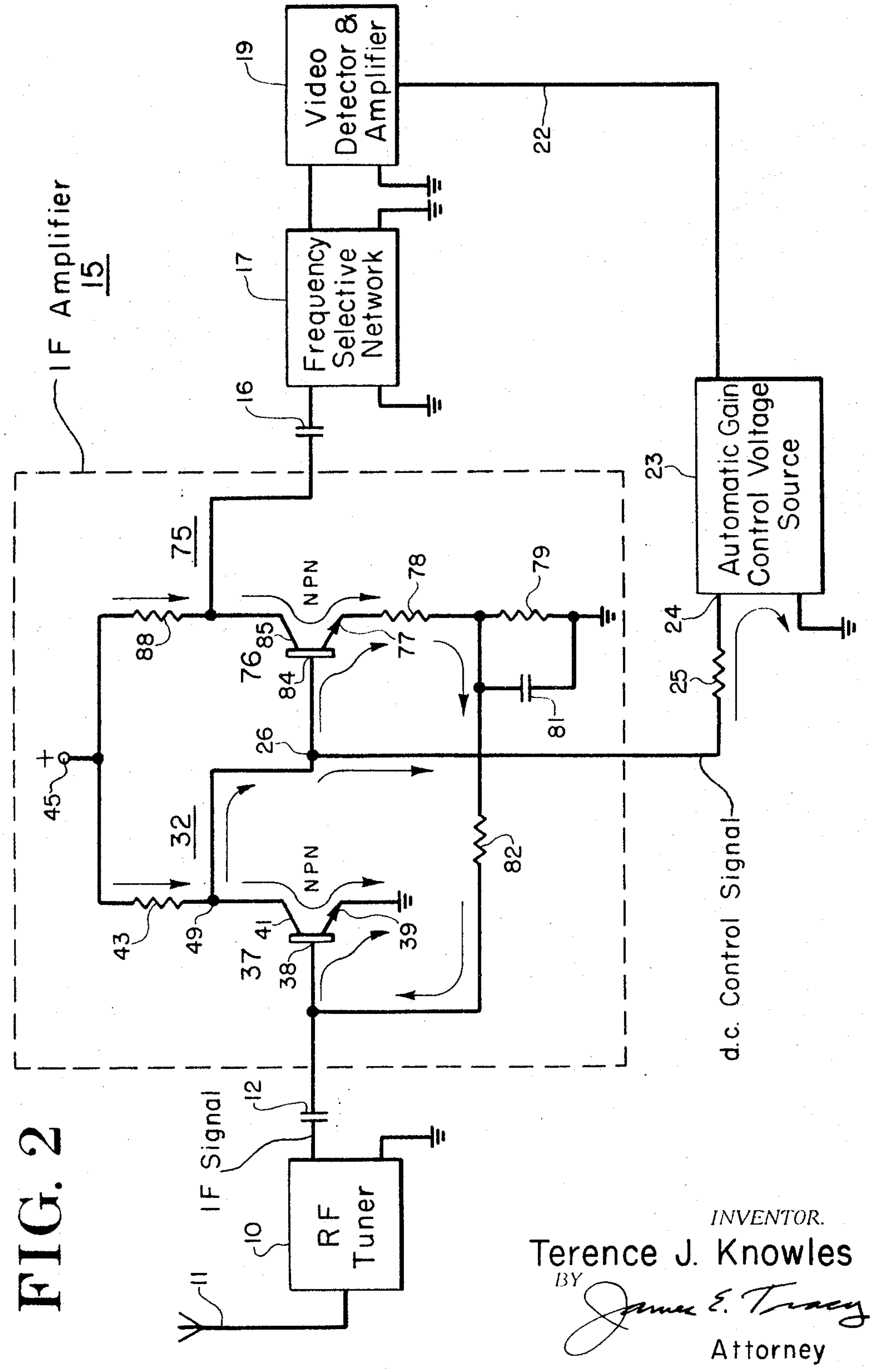

The features of this invention which are believed to be new are set forth with particularity in the appended claims. The invention, together with further objects and advantages thereof, may best be understood, however, by reference to the following description in conjunction with the accompanying drawings, in the figures of which like reference numerals identify like elements, and in which:

FIGURE 1 is a schematic representation of a portion of a television receiver which includes a controlled signal amplifying system constructed in accordance with one embodiment of the invention; and FIGURE 2 is a schematic diagram of a modification of the circuitry of FIGURE 1 and illustrates another embodiment of the invention.

For convenience of explanation, it is assumed that both the FIGURE 1 and FIGURE 2 embodiments are incorporated in television receivers of the monochrome or black-and-white type. As will be obvious, however, the illustrated amplifying systems may be employed in color television sets.

Turning now to a description of the embodiment of FIGURE 1, block 10 represents the RF tuner of a conventional monochrome television receiver and customarily includes an RF or radio frequency amplifier, a local oscillator and a mixer. The input of the RF amplifier is connected to a receiving antenna 11. Under the television transmission standards existing in the United States, a television signal picked up by antenna 11 includes two separate RF carriers, separated in the frequency spectrum by 4.5 megahertz, one of the carriers being amplitude modulated by the picture or video information while the other is frequency modulated by the sound information. In accordance with the superheterodyne technique, the received RF carriers are beat or heterodyned with the local oscillator signal to produce in the tuned or frequency selective output circuit of the mixer, which provides the output of the RF tuner, an IF or intermediate frequency signal which includes and is a combination of a sound IF carrier and a video IF carrier respectively conveying sound and picture information. The two IF carriers, making up the IF signal, are 4.5 megahertz apart and may, for example, exhibit the frequencies 41.25 megahertz and 45.75 megahertz respectively.

The lower output terminal of tuner 10 is connected to a plane of reference potential such as ground, while its upper output terminal is connected through a coupling capacitor 12 to the input of a plural-stage IF amplifier 15 whose output is coupled via a capacitor 16 to the input of a frequency selective network 17. Ignoring for the moment the structural details of amplifier 15, suffice it to say at this juncture that the amplifier constitutes an automatic gain controlled IF amplifying channel which is capable of amplifying the IF signal, produced in the output of tuner 10, to the extent necessary before video and sound detection. Network 17, which constitutes a "block of selectivity," is constructed to select a band of frequencies in the vicinity from 41.25 megahertz to 45.75 megahertz with an appropriate IF band pass characteristic in order that all the picture and sound information carried by the IF signal will be produced in the output of network 17 while extraneous noise components outside of that band and adjacent television channels, which may be translated through amplifier 15, will be eliminated.

The output of network 17 is coupled to the input of a unit 19 which contains a video detector, for detecting or deriving the video information from the video IF carrier to develop a composite video signal, and an amplifier for amplifying that composite video signal. Sound demodulating circuitry (not shown) is coupled to unit 19 to derive the sound information from the intercarrier component of the IF signal, namely the 4.5 megahertz component which will contain the sound information in accordance with the intercarrier principle. The output of the video amplifier portion of block 19 may be supplied to the input of the image reproducer or picture tube (not shown) of the receiver.

The video amplifier is also coupled, via a connection 22, to the input of a source of D.C. control signal, specifically an automatic gain control voltage source or generator 23. The AGC source may be of conventional construction and is keyed or grated to examine the amplitude of the sync pulses of the composite video signal, which amplitude represents and is proportional to the strength or level of the RF carrier waves received at the input of RF tuner 10, and from such examinations a D.C. or unidirectional AGC voltage is developed whose magnitude varies in response to variations in the signal strength of the received television signal.

The lower output terminal of AGC voltage source 23 is connected to ground while its upper output terminal, labeled 24, is connected through a resistor 25 to an input (specifically to a circuit junction labeled 26) of IF amplifier 15 in order to supply a D.C. control signal to the IF amplifier to control its gain in a manner to be explained. For reasons to be appreciated later, source 23 is constructed so that the AGC voltage developed thereby and produced at output terminal 24 is always negative with respect to the voltage at junction 26 regardless of the signal strength at antenna 11 and even in the absence of an RF signal. The magnitude of the gain control voltage, in a negative direction, is directly proportional to the received signal strength; the greater the strength or level of the RF carriers received at antenna 11, the greater will be the negative AGC voltage produced at terminal 24.

Consideration will now be given to the details of IF amplifier 15 which embodies the invention. It includes a series of three D.C. coupled cascaded transistorized amplifying stages 32, 34 and 36. More particularly, the first or input stage 32 comprises a transistor 37 of the bipolar type and NPN gender. It is coupled in common emitter configuration, its input terminal thus being connected to its base 38, its common terminal to its emitter 39, and its output terminal to its collector 41. The coupling from RF tuner 10 to amplifier 15 is specifically connected to base 38 to receive the picture and sound IF carrier. Emitter 39 is connected to ground, and collector 41 is connected through a load resistor 43 to the positive terminal 45 of a source of D.C. or unidirectional operating potential, the negative terminal of which is grounded.

Stages 34 and 36 are constructed similarly to stage 32. Specifically, second stage 34 includes a bipolar transistor 46 of the NPN variety having its emitter 47 grounded, its base 48 D.C. or direct coupled through junction 26 to the junction 49 of collector 41 and resistor 43, and its collector 51 connected through a load resistor 52 to positive potential source 45. The D.C. control signal from source 23 is introduced between stages 32 and 34, since input terminal or junction 26 is in the D.C. connection from junction 49 to base 48. The last or output stage 36 likewise has a bipolar NPN transistor 55 having its emitter 56 connected to ground, its base 57 D.C. coupled to the junction 58 of collector 51 and resistor 52, and its collector 59 connected via a load resistor 61 to the positive voltage source 45.

In order to provide conventional bias stabilization, and also to facilitate the operation of the invention, a negative or degenerative D.C. feedback connection is provided from the output of the last stage 36 to the input of the first stage 32. Specifically, the junction 62 of collector 59 and resistor 61 is coupled through the series-connected resistors 64 and 65 to base 38 of transistor 37. The junction of resistors 64 and 65 is coupled to ground through a decoupling capacitor 66 to prevent any A.C. feedback of the IF carriers so that maximum A.C. amplification may be obtained. The ampified IF output signal of amplifier 15 is obtained at junction 62 and thus that junction is coupled via capacitor 16 to the input of network 17.

Preferably, each of the three amplifying stages 32, 34 and 36 is biased for Class A operation. Hence, the various circuit elements including potential source 45 will be selected so that the base-emitter junction of each of transistors 37, 46 and 55 will be forward biased (i.e. each base will be positive with respect to its associated emitter) at all times and their collector-base junctions will be reverse biased. Direct current will thus constantly flow through the various portions of amplifier 15 in the directions indicated by the several arrows shown in FIGURE 1. In other words, with or without an A.C. input signal from source 10 a D.C. component will exist in each of the D.C. paths and will flow in the direction indicated. As previously stated, output terminal 24 of AGC voltage source 23 is always negative with respect to junction 26 regardless of the strength or level of the incoming television signal received at antenna 11. For that reason there will always be some direct current flowing in the connection (and in the direction) from circuit junction 26 to terminal 24. The amplitude of the AGC current flowing toward terminal 24 will be directly proportional to the strength of the received RF signal picked up by antenna 11.

Note also that junction 62 is always positive relative to base 38 which causes the feedback connection to supply current into base 38. As will be seen, the D.C. in the feedback connection will vary slightly (and in an inverse sense) responsive to changes in RF signal strength. The static emitter-collector current of transistor 37 will also vary in response (and will be inversely proportional) to changes in RF signal strength at antenna 11. In this way, the gain of stage 32 is varied. As will also be appreciated, and in accordance with a salient feature of the invention, the static emitter-collector currents of transistors 46 and 55 will remain substantially stabilized in spite of static current changes in transistor 37.

For zero A.C. input to amplifier 15 the static or quiescent currents flowing in the three transistors and the D.C. voltages existing at the collectors establish the operating or working points on the characteristic curves for the three stages. More particularly, the characteristic curve of each stage plots the collector-to-emitter voltage along the ordinate axis and the collector current along the abscissa for the static base current. The operating point along that curve is determined by the collector voltage when there is zero A.C. input. Preferably, the operating point of each stage is established well within the linear portion of its characteristic curve in order to preclude the possibility of introducing distortion to the IF carriers to be amplified by amplifier 15. In a manner to be explained, the operating point of stage 32 (and thus its gain) will be adjusted in response to variations in the magnitude of the AGC control voltage produced by source 23. However, even for the most extreme conditions the operating point shift will still be confined to the linear portion of the curve. Static current stabilization in stages 34 and 36 stabilizes the operating points of those stages to avoid the introduction of distortion, and this will occur even in the presence of substantial alterations of the operating point of stage 32. Of course, for zero A.C. input the operating point of stage 32 is established to achieve maximum gain.

In describing the operation of amplifier 15, it will initially be assumed that a relatively weak television signal is picked up by antenna 11 and processed in RF tuner 10 to produce an IF output signal. Under those conditions, the negative AGC voltage at terminal 24 will be of minimum amplitude and will be approximately the same as explained hereinbefore for the zero A.C. input conditions. Stage 32 will thus be conditioned to impart to an applied input signal the maximum amplification of which it is capable. Stage 32 responds to the IF signal applied to base 38 to develop an amplified replica of that IF signal at junction 49, which in turn is further amplified by the second stage 34 and then by the last stage 36 to the extent that the amplified IF signal, produced at junction 62 and applied to the input of frequency selective network 17, is of an amplitude sufficient to appropriately drive the audio and video signal processing circuitry.

Network or "block of selectivity" 17 selects the sound and picture carriers, making up the IF signal, and their associated modulation components in accordance with the required IF band pass characteristic so that a predetermined relationship exists between the amplitudes of the various components. The video detector of unit 19 derives the composite video signal from the picture IF carrier and after amplification in the video amplifier it is supplied to the input of the picture tube. The sound channel responds to the 4.5 megahertz intercarrier component and derives therefrom the sound information which is then amplified and supplied to a speaker.

The amplified composite video signal is also applied, over connection 22, to AGC voltage generator 23 which produces a D.C. control signal the magnitude of which is directly proportional to the strength of the RF signal received over antenna 11, and for the initially assumed weak signal conditions the D.C. control signal will have its minimum amplitude and will be approximately equal to that existing in the complete absence of an RF signal.

Assuming now that the strength of the received television signal increases to the extent that AGC action is necessary, unit 23 responds to the increased amplitude of the sync pulses of the composite video signal to increase the amplitude of the negative voltage at terminal 24. More direct current must therefore flow from junction 26 and through resistor 25 to terminal 24. The initial effect of the negative-going AGC voltage is that base 48 of transistor 46 becomes less positive with respect to emitter 47 and this reduces the forward bias of that transistor and decreases its emitter-collector current. The base current of transistor 46 essentially decreases by the amount that the D.C. flowing from junction 26 to terminal 24 increases.

Collector 51 and junction 58 thus become more positive and this in turn increases the forward bias of transistor 55 to effect increased emitter-collector current in that transistor. As a result, junction 62 becomes less positive and, because of the feedback connection, this causes a reduction in the forward bias of transistor 37 and a decrease in the base current supplied to base 38 through the feedback path. The emitter-collector current of transistor 37 consequently decreases and this causes junction 49 to become more positive.

Thus, a negative-going AGC voltage applied to junction 26, and consequently to the input of transistor 46, from source 23 is translated through the closed loop, including all three of stages 32, 34 and 36 and the feedback connection, and back to junction 26 as a positive-going voltage. The result is that the AGC control signal initially applied to the input of stage 34 is substantially cancelled or neutralized by the control signal itself which translates through the closed loop and is effectively fed back to the input of transistor 46 in opposite polarity. Degenerative feedback exists with respect to the D.C. control signal supplied to the input of stage 34. When the AGC control signal from source 23 varies in one sense or in the direction of one polarity the negative feedback loop produces that control signal with a variation in the opposite sense or in the opposite polarity direction.

As a consequence, after the slight feedback delay required for the control signal to travel around the loop, stages 34 and 36 assume the same operating points at which they functioned prior to the increase in received signal strength. This is not true, however, with respect to stage 32. The cancellation of the control signal at the input of stage 34 is made sufficiently complete to effect no significant change in the normal operating points of stages 34 and 36. The amplitude difference between the control signal from source 23 and the control signal fed back to the input of stage 34 will be such that a net, extremely small amplitude control signal manifests in the input of stage 34 to maintain a reduction in the static base-emitter current of transistor 37 in an amount adequate to maintain a decrease in the static emitter-collector current of that transistor to the extent necessary to achieve the required gain reduction in stage 32. Transistors 37, 46 and 55 are preferably high gain devices, as a result of which almost negligible base current need be supplied to transistor 55 to provide the necessary control at base 38. As will be noted, the illustrated circuit of FIGURE 1 employs reverse AGC; namely, gain is reduced by decreasing the static base current.

Since substantially the same amount of base current flows in transistor 46 before and after the feedback delay, the increased current required by source 23 is response to the stronger received RF signal must flow (after the feedback delay) from junction 49 to terminal 24. When the AGC voltage at terminal 24 becomes more negative in response to an increase in received signal strength, current is effectively extracted from transistor 37 and supplied to AGC voltage source 23. In reducing the emitter current of transistor 37 and consequently its gain, the static emitter-collector current of the transistor decreases while the current from junction 49 and through junction 26 to terminal 24 increases.

The circuit may be arranged so that the amount by which the collector current is reduced is substantially equal to the magnitude of current that must flow into terminal 24. Stage 32 may be constructed so that resistor 43 effectively constitutes a constant current source. The D.C. voltage at junction 49 would then always be constant regardless of signal strength. The constant direct current flowing through junction 49 would divide and flow through the two parallel paths provided by the emitter-collector path of transistor 37 and by the path from junction 26 to terminal 24 and through the output of source 23. The divisional ratio would be dependent and related to the RF signal strength; the stronger the RF signal, the greater will be the D.C. flowing into the output of source 23 and the less will be the collector current in transistor 37.

The circuit of course functions in opposite manner when the received signal strength decreases. Very briefly, terminal 24 becomes less negative, causing a positive-going voltage at base 48 and an increase in base-emitter current in transistor 46 with a resultant decreased (less positive) voltage produced at junction 58. This in turn causes a decrease in the base current of transistor 55 and an increased (more positive) voltage at junction 62, as a consequence of which the base-emitter current of transistor 37 increases which produces a negative-going voltage at junction 49 to substantially nullify the control signal applied to the input of transistor 46. The operating points of stages 34 and 36 return to their normal positions. The increase in the emitter current of stage 32 persists, however, after the feedback delay and therefore the gain of that stage increases and remains at the increased value so long as the AGC control signal from source 23 remains at a constant amplitude.

While the D.C. control signal in the FIGURE 1 embodiment automatically varies in amplitude each time the gain of amplifier 15 is to be changed, the invention may obviously be practiced by a manual adjustment of the control signal magnitude. For example, the amplifying system of the invention may be incorporated in transmitter studio equipment in which case it may be desirable for the engineer or operator to manually control the amplitude of the control signal by means of, for example, a simple potentiometer and a D.C. voltage source.

The invention, of course, is not limited to any particular number of D.C. coupled cascaded amplifying stages. Moreover, it is not necessary that an odd number of stages be employed. In fact, the invention may even be employed in a two-stage amplifier as shown in FIGURE 2. In that embodiment, the first stage 32 is of similar construction to the identically numbered stage in FIGURE 1. The second or last stage 75 is of different construction in order to facilitate the derivation of a negative or degenerative feedback for application to the input of stage 32. Specifically, stage 75 includes an NPN bipolar transistor 76 having its emitter 77 coupled through the series-connected resistors 78 and 79 to ground. The junction of the two resistors is bypassed to ground via a decoupling capacitor 81 (to preclude A.C. feedback) and is also connected through a resistor 82 to base 38 of transistor 37. The base 84 of transistor 76 is direct coupled through junction 26 to collector 41 of transistor 37 and collector 85 of transistor 76 is coupled through a load resistor 88 to positive potential source 45.

The overall gain of the two-stage amplifier of FIGURE 2 should be adequate to impart the necessary amplification to an IF input signal applied to base 38. Signal changes at base 84 result in in-phase changes at its emitter and thus the feedback connection supplies the required degenerative feedback to the input of stage 32. In other words, if a negative-going voltage develops at junction 26 by the action of source 23 in response to increased signal strength, a negative-going voltage will also be produced at the junction of resistors 78 and 79 for application through resistor 82 to base 38 and this in turn produces a positive-going voltage at junction 49 to substantially nullify the negative-going voltage initially applied to junction 26.

It should also be apparent that the controlled stage need not be the first stage of a multi-stage amplifier, in which case operating point stabilization is achieved not only in the stages following the one that is controlled but also in the stage or stages preceding the controlled stage. For example, it may be desirable to employ a four-stage amplifier with the second stage gain controlled. A feedback connection would be provided between the output of the fourth stage and the input of the first, and the automatic gain control signal would initially be applied to the input of the third stage. The operating point of the second stage would change in response to amplitude variations of the control signal, and yet the operating points of the first, third and fourth stages would remain substantially unchanged.

The invention provides, therefore, an improved plural-stage amplifier, with D.C. interstage coupling, in which a D.C. control signal is utilized to vary the operating point of one of the stages to control a parameter of the amplifier without significantly changing the operating point of any stage succeeding that which is conrtolled. The amplifier includes primarily resistors and transistors and thus is highly integratable.

I claim:

1. A controlled signal amplifying system comprising:
- an amplifier including a plurality of D.C. coupled cascaded transistorized amplifying stages each of which is biased to operate at a particular operating point on its characteristic curve;
- a source of a D.C. control signal for controlling a predetermined parameter of said amplifier;
- means for introducing said D.C. control signal between the output of one of said cascaded amplifying stages and the input of the immediately subsequent stage; and
- means, including said one stage, for providing degenerative feedback from the output to the input of said subsequent stage to substantially nullify said control signal at the input of said subsequent stage to stabilize the operating point of each stage following said one stage while at the same time varying the operating point of said one stage to change said predetermined parameter of said amplifier.

2. A controlled signal amplifying system according to claim 1 in which said amplifier includes at least three amplifying stages, and wherein said D.C. control signal is applied to the input of the second stage to vary the operating point of the first stage without significantly altering the operating point of each stage following said first stage.

3. A controlled signal amplifying system according to claim 1 and including a degenerative D.C. feedback connection from the output of the last of said cascaded stages to the input of the first stage; said control signal being translated through the closed loop, containing all of said stages and said feedback connection, and back to the input of said subsequent stage in order to substantially cancel said control signal at the input of said subsequent stage; and said control signal, in translating through said one stage, effecting said operating point variations.

4. A controlled signal amplifying system according to claim 1 in which the amplitude of said D.C. control signal varies each time the operating point of said one stage is to be altered, wherein said control signal amplitude variations are applied to the input of said subsequent stage and developed in the output of the last of said stages, and having means including a feedback connection for supplying said amplitude variations to the input of said one stage to change its operating point, said amplitude variations being produced in the output of said one stage but varying in a sense opposite to that of said amplitude variations applied to the input of said subsequent stage.

5. A controlled signal amplifying system according to claim 1 in which said D.C. control signal controls the gain of said amplifier.

6. A controlled signal amplifying system according to claim 5 in which said D.C. control signal is an automatic gain control signal.

7. A controlled signal amplifying system according to claim 1 in which each of said amplifying stages has a resistive load.

8. A controlled signal amplifying system comprising:

an amplifier including a plurality of D.C. coupled cascaded transistorized amplifying stages each of which is biased to operate at a particular operating point on its characteristic curve and each of which stages includes only a single transistor;

a source of a D.C. control signal for controlling a predetermined parameter of said amplifier; and means, including a D.C. feedback connection from the output of the last of said cascaded stages to the input of the first stage, for utilizing said control signal to vary the operating point of one of said stages, other than the last stage, to change said predetermined parameter of said amplifier without significantly altering the operating point of each stage following said one stage.

References Cited

UNITED STATES PATENTS

| | | | |
|---|---|---|---|
| 3,141,137 | 7/1964 | Greutman | 330—29 |
| 3,210,683 | 10/1965 | Pay. | |
| 3,258,695 | 6/1966 | Brown et al. | 325—319 X |
| 3,323,078 | 5/1967 | Falk. | |

ROY LAKE, *Primary Examiner.*

J. B. MULLINS, *Assistant Examiner.*

U.S. Cl. X.R.

330—19, 25